(12) United States Patent
Ogura

(10) Patent No.: US 9,293,548 B2
(45) Date of Patent: Mar. 22, 2016

(54) SEMICONDUCTOR DEVICE

(71) Applicant: KABUSHIKI KAISHA TOSHIBA, Tokyo (JP)

(72) Inventor: Tsuneo Ogura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/685,053

(22) Filed: Apr. 13, 2015

(65) Prior Publication Data

US 2015/0221736 A1 Aug. 6, 2015

Related U.S. Application Data

(62) Division of application No. 13/232,839, filed on Sep. 14, 2011, now Pat. No. 9,029,918.

(30) Foreign Application Priority Data

Sep. 15, 2010 (JP) .................................. 2010-206379

(51) Int. Cl.
*H01L 29/423* (2006.01)
*H01L 29/10* (2006.01)
(Continued)

(52) U.S. Cl.
CPC ...... *H01L 29/42356* (2013.01); *H01L 29/1095* (2013.01); *H01L 29/41741* (2013.01); *H01L 29/41766* (2013.01); *H01L 29/66348* (2013.01); *H01L 29/7397* (2013.01);
(Continued)

(58) Field of Classification Search
CPC .................................. H01L 29/7393

USPC .......................................................... 257/139
See application file for complete search history.

(56) References Cited

U.S. PATENT DOCUMENTS 5,376,575 A 12/1994 Kim et al.
5,502,320 A 3/1996 Yamada
(Continued)

FOREIGN PATENT DOCUMENTS

EP 1170803 A2 1/2002
JP 2000058823 A 2/2000
(Continued)

OTHER PUBLICATIONS

Chinese Office Action dated Oct. 31, 2013, filed in Chinese counterpart Application No. 201110265504.2, 14 pages (with translation).
(Continued)

*Primary Examiner* — Mark Tornow
(74) *Attorney, Agent, or Firm* — Patterson & Sheridan, LLP

(57) ABSTRACT

According to one embodiment, a semiconductor device includes a first major electrode, a first semiconductor layer, a first conductivity-type base layer, a second conductivity-type base layer, a second semiconductor layer, a buried layer, a buried electrode, a gate insulating film, a gate electrode, and a second major electrode. The buried layer of the second conductivity type selectively is provided in the first conductivity-type base layer. The buried electrode is provided in a bottom portion of a trench which penetrates the second conductivity-type base layer to reach the buried layer. The buried electrode is in contact with the buried layer. The gate electrode is provided inside the gate insulating film in the trench. The second major electrode is provided on the second semiconductor layer and is electrically connected to the second semiconductor layer and the buried electrode.

10 Claims, 9 Drawing Sheets

(51) Int. Cl.
*H01L 29/417* (2006.01)
*H01L 29/66* (2006.01)
*H01L 29/739* (2006.01)
*H01L 29/78* (2006.01)
*H01L 29/06* (2006.01)

(52) U.S. Cl.
CPC ....... *H01L 29/7805* (2013.01); *H01L 29/7813* (2013.01); *H01L 29/7831* (2013.01); *H01L 29/0696* (2013.01)

(56) References Cited

U.S. PATENT DOCUMENTS

| | | | |
|---|---|---|---|
| 6,274,437 | B1 | 8/2001 | Evans |
| 6,747,295 | B2 | 6/2004 | Inoue et al. |
| 6,987,040 | B2 | 1/2006 | Venkatraman |
| 7,453,107 | B1 * | 11/2008 | Kapoor ............. H01L 29/66901 257/134 |
| 7,456,487 | B2 * | 11/2008 | Ogura ................. H01L 29/0834 257/563 |
| 7,800,168 | B2 | 9/2010 | Ogura et al. |
| 2001/0025984 | A1 | 10/2001 | Osawa |
| 2003/0075760 | A1 | 4/2003 | Osawa |
| 2005/0056886 | A1 * | 3/2005 | Tihanyi ................. H01L 29/866 257/330 |
| 2006/0214222 | A1 * | 9/2006 | Challa ................. H01L 21/3065 257/328 |
| 2012/0025874 | A1 | 2/2012 | Saikaku et al. |

FOREIGN PATENT DOCUMENTS

| | | |
|---|---|---|
| JP | 2001284584 A | 10/2001 |
| JP | 2006093457 A | 4/2006 |
| JP | 2007294556 A | 11/2007 |
| JP | 2010114152 A | 5/2010 |

OTHER PUBLICATIONS

Japanese Office Action dated Aug. 6, 2013, filed in Japanese counterpart Application No. 2010-206379, 5 pages (with translation).
Japanese Office Action dated Dec. 21, 2012, filed in Japanese counterpart Application No. 2010-206379, 4 pages (with translation).
R. Constapel, et al., "Trench-IGBTs with Integrated Diverter Structures", International Symposium on Power Semiconductor Devices & ICs, Yokohamo, 1995, p. 201 Fig. 2.

* cited by examiner

US 9,293,548 B2

SEMICONDUCTOR DEVICE

CROSS-REFERENCE TO RELATED APPLICATION

This application is a division of U.S. patent application Ser. No. 13/232,839, filed on Sep. 14, 2011, which is based upon and claims the benefit of priority from Japanese Patent Application No. 2010-206379, filed on Sep. 15, 2010; the entire contents of each of which are incorporated herein by reference.

FIELD

Embodiments described herein relate generally to a semiconductor device.

BACKGROUND

For power devices, for example, a vertical Metal-Oxide-Semiconductor Field Effect Transistor (MOSFET) having a trench gate structure has been widely used. For example, in the N-channel type, when a positive bias is applied to a gate electrode, an N channel is formed in a vicinity of an interface with a gate insulating film in a P-type base layer, and electrons flow from a source layer into a drain electrode via the N channel, an N-type base layer and a drain layer, to form an on state.

In this configuration, by reducing a trench interval, a channel density increases, which makes it possible to reduce an on-resistance. However, when the trench interval is reduced, an area of the P-type base layer in contact with the source electrode between the trenches becomes smaller. This causes an increase in discharge resistance of holes at Avalanche breakdown, i.e., lower breakdown tolerance.

DETAILED DESCRIPTION

Figure 1:
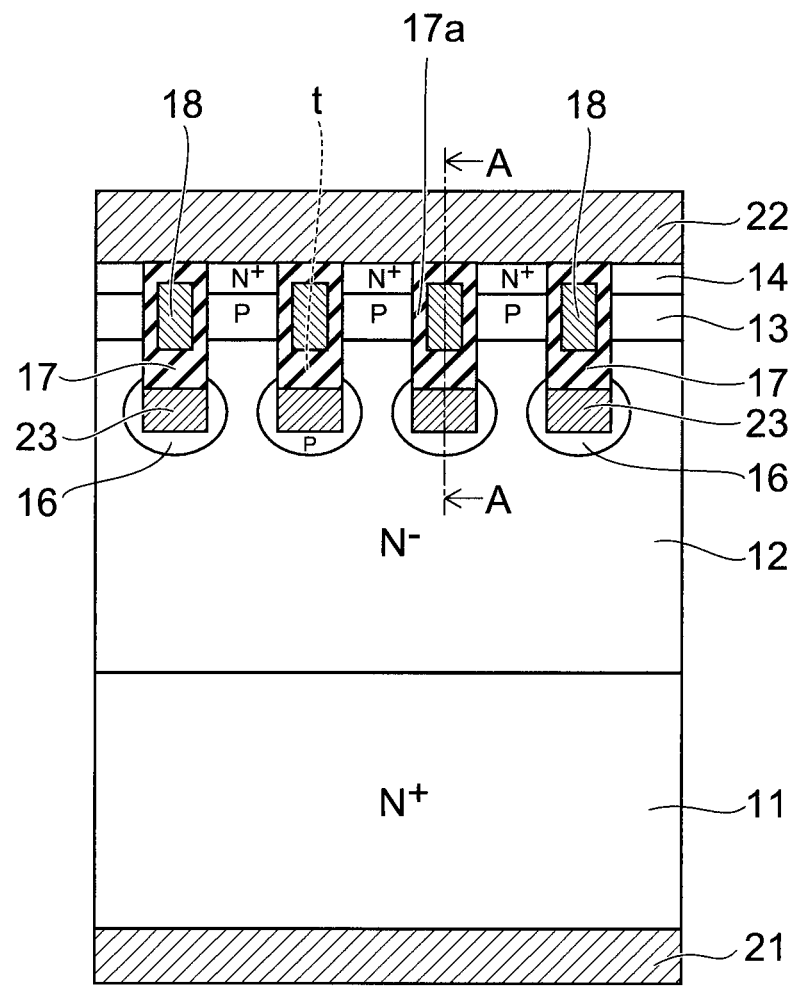
FIG. 1 is a schematic cross-sectional view of a semiconductor device in a first embodiment.

According to one embodiment, a semiconductor device includes a first major electrode, a first semiconductor layer, a first conductivity-type base layer, a second conductivity-type base layer, a second semiconductor layer, a buried layer, a buried electrode, a gate insulating film, a gate electrode, and a second major electrode. The first semiconductor layer is provided on the first major electrode. The first conductivity-type base layer is provided on the first semiconductor layer. The second conductivity-type base layer is provided on the first conductivity-type base layer. The second semiconductor layer of the first conductivity type is provided on the second conductivity-type base layer. The buried layer of the second conductivity type selectively is provided in the first conductivity-type base layer. The buried electrode is provided in a bottom portion of a trench which penetrates the second conductivity-type base layer to reach the buried layer. The buried electrode is in contact with the buried layer. The gate insulating film is provided on a side wall of the trench at a portion above the buried electrode. The gate electrode is provided inside the gate insulating film in the trench. The second major electrode is provided on the second semiconductor layer. The second major electrode is electrically connected to the second semiconductor layer and the buried electrode.

Hereinafter, embodiments are described with reference to the drawings. In each of the drawings, same components are designated by the same reference numerals. In the following, explanations will be given in the case where the first conductivity type is the N-type, and the second conductivity type is the P-type. However, it is also applicable to the case where the first conductivity type is the P-type, and the second conductivity type is the N-type. For a semiconductor, silicon is used. Alternatively, other semiconductor than silicon (for example, a compound semiconductor such as SiC, GaN, or the like) may be used.

A semiconductor device according to the embodiment is a vertical device in which a current path is formed in a vertical direction connecting a first major electrode provided on one major surface side of a semiconductor layer (or a substrate) and a second major electrode provided on the other major surface side. However, the embodiment is also applicable to a lateral device having the first major electrode and the second major electrode provided on the same major surface side as the first major electrode.

In the following embodiments, Metal-Oxide-Semiconductor Field Effect Transistor (MOSFET) is adopted as an example of the semiconductor device. However, an Insulated Gate Bipolar Transistor (IGBT) may be adopted. In the case of the IGBT, an $N^+$-type drain layer 11 to be explained hereinafter may be simply replaced with a $P^+$-type collector layer.

FIRST EMBODIMENT

FIG. 1 is a schematic cross-sectional view of a semiconductor device of a first embodiment.

Figure 2:
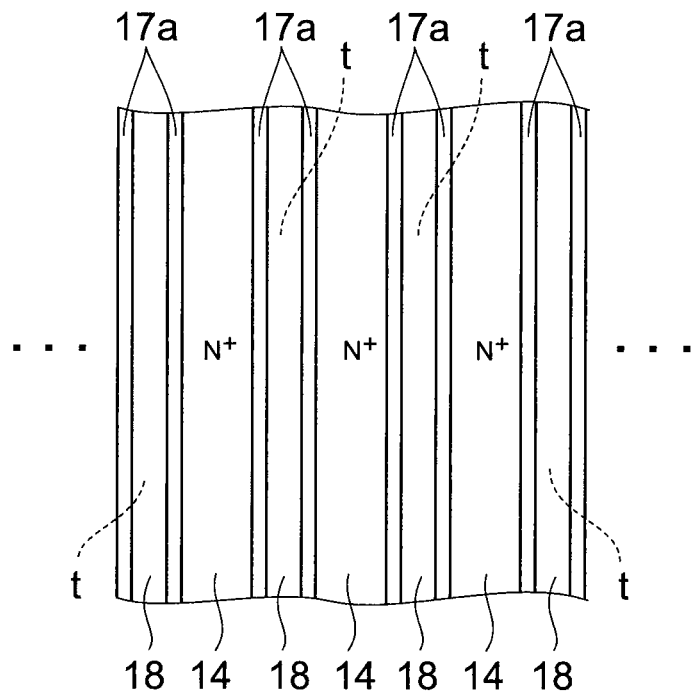
FIG. 2 is a schematic plan view of the semiconductor device in the first embodiment.

FIG. 2 is a schematic view illustrating a planar layout of major elements in the semiconductor device.

Figure 3:
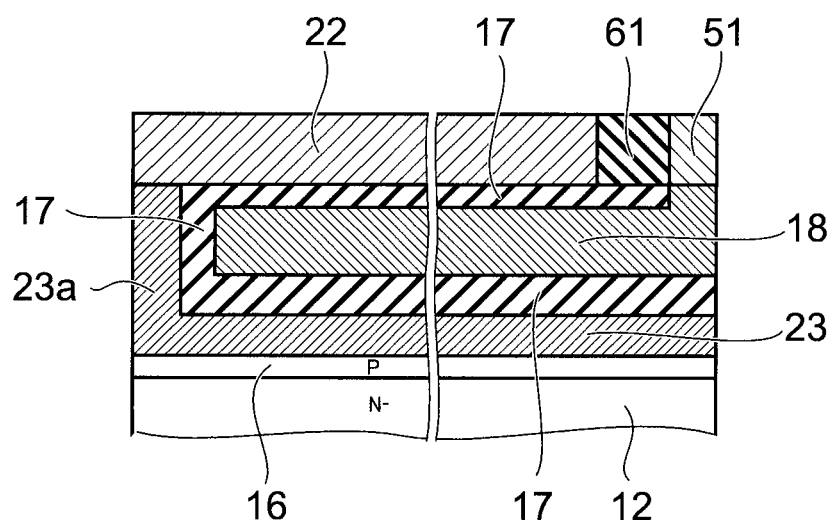
FIG. 3 is an A-A section view in FIG. 1.

FIG. 3 is a cross-sectional view taken along the line A-A of FIG. 1.

A semiconductor layer includes an $N^+$-type drain layer 11, an $N^-$-type base layer 12, a P-type base layer 13, an $N^+$-type source layer 14 and a P-type buried layer 16. The $N^+$-type drain layer 11 and the $N^+$-type source layer 14 have higher N-type impurity concentration than the $N^-$-type base layer 12.

The $N^-$-type base layer 12 is provided on the $N^+$-type drain layer 11. The P-type base layer 13 is provided on the $N^-$-type base layer 12. The $N^+$-type source layer 14 is provided on the P-type base layer 13. The P-type buried layer 16 is selectively provided in plural in the $N^-$-type base layer 12.

On the surface side of the semiconductor layers, a plurality of trenches t are formed. The plurality of trenches t are, for example, formed side by side in a lateral direction in a striped planar pattern. Here, the "lateral direction" is a direction substantially parallel to a major surface of the semiconductor layer (or substrate).

Each trench t extends from a surface of the N+-type source layer 14 and penetrates the P-type base layer 13 to reach the P-type buried layer 16. The P-type buried layer 16 is provided around a bottom portion of the trench t. Namely, the P-type buried layer 16 is adjacent to a bottom face and a side wall in a vicinity of the bottom face of the trench t.

The trench t divides a stacked structure of the P-type base layer 13 and the N+-type source layer 14 into plural in a lateral direction. The P-type base layer 13 and the N+-type source layer 14 are adjacent to the side wall of the trench t.

At the bottom portion of the trench t, a buried electrode 23 is provided. A bottom face and a side face of the buried electrode 23 are in ohmic contact with the P-type buried layer 16.

An insulating film 17 is provided on the buried electrode 23 in the trench t. In the insulating film 17, the insulating film provided to the side wall of the trench t at a portion above the buried electrode 23 is particularly defined as a gate insulating film 17a.

The gate electrode 18 is provided inside the gate insulating film 17a in the trench t. The gate electrode 18 faces the P-type base layer 13 with the gate insulating film 17a therebetween. The upper end of the gate electrode 18 is positioned slightly closer to the side of the N+-type source layer 14 than an interface between the p-type base layer 13 and the N+-type source layer 14. The lower end of the gate electrode 18 is positioned slightly closer to the side of the N−-type base layer 12 than the interface between the P-type base layer 13 and the N−-type base layer 12. The insulating film 17 is interposed between the gate electrode 18 and the buried electrode 23.

As shown in FIG. 2, the trench t, the N+-type source layer 14 and the gate electrode 18 are formed, for example, in a striped planar pattern. The P-type base layer 13 is also formed in a striped planar pattern under the N+-type source layer 14. Namely, the N+-type source layer 14 is formed on the P-type base layer 13 in the striped planar pattern with the same width as the pattern of the P-type base layer 13 to be overlapped therewith.

On a face of the drain layer 11 opposite to a face thereof on which the N−-type base layer 12 is provided, a first major electrode 21 is provided. The drain layer 11 is in ohmic contact with the first major electrode 21, and is electrically connected to the first major electrode 21.

On the N+-type source layer 14 and the trench t, a second major electrode 22 is provided. The second major electrode 22 is in ohmic contact with the surface of the N+-type source layer 14, and is electrically connected to the N+-type source layer 14. The insulating film 17 is interposed between the gate electrode 18 and the second major electrode 22.

The buried electrode 23 is electrically connected to the second major electrode 22. An example structure thereof is illustrated in FIG. 3. As shown in FIG. 3, a portion 23a of the buried electrode 23 is led upward to be connected to the second major electrode 22. The gate electrode 18 is not provided in a portion of the trench t. In that portion, a portion 23a of the buried electrode 23 extends in the trench t in a depthwise direction. Via this portion 23a, the buried electrode 23 is electrically connected to the second major electrode 22. Therefore, the buried layer 16 which is in ohmic contact with the buried electrode 23 is electrically connected to the second major electrode 22 via the buried electrode 23. The structure shown in FIG. 3 is merely one example, and it is necessary that the buried electrode 23 be electrically connected to the second major electrode 22.

Additionally, a portion of the gate electrode 18 is led upward to be connected to a gate wiring 51 provided on the trench t. The gate wiring 51 is dielectrically isolated from the second major electrode 22 by an insulating layer 61.

The first major electrode 21 and the second major electrode 22 are made of, for example, a metallic material. The buried electrode 23 and the gate electrode 18 are made of a semiconductor material (for example polycrystalline silicon) to which an impurity is added and which has conductivity. Alternatively, metal may be used for the buried electrode 23 and the gate electrode 18.

In the state where relatively high potential is applied to the first major electrode 21 and relatively low potential is applied to the second major electrode 22, when a desired gate potential is applied to the gate electrode 18, an inversion layer (channel) is formed in a vicinity of the interface with the gate insulating film 17a in the P-type base layer 13. For example, ground potential or negative potential is applied to the second major electrode 22, and positive gate potential is applied to the gate electrode 18. To the first major electrode 21, positive potential higher than the gate potential is applied.

As a result, current flows between the second major electrode 22 and the first major electrode 21 via the N−-type source layer 14, the channel, the N−-type base layer 12, and the N+-type drain layer 11, to form an on state.

Moreover, when the avalanche breakdown occurs at turn off, the hole current flows into the second major electrode 22 via the buried layer 16 and the buried electrode 23 in ohmic contact with the buried layer 16. As a result, a device breakdown can be suppressed.

In a power device of the trench gate structure, the electric field is liable to be high particularly in a vicinity of the bottom portion of the trench, and the avalanche breakdown is liable to occur in the vicinity of the bottom portion of the trench. In the embodiment, since the buried layer 16 is provided around the bottom portion of the trench t, the breakdown phenomena can be suppressed effectively.

Additionally, according to the embodiment, it is possible to discharge holes at avalanche breakdown via the P-type buried layer 16 without making the P-type base layer 13 in contact with the second major electrode 22. Therefore, it is not necessary to ensure the contact between the P-type base layer 13 and the second major electrode 22 between the adjacent trenches t including the channel forming region. As a result, it is possible to reduce a trench interval.

By reducing the trench interval, it is possible to increase the channel density and reduce the on-resistance. Namely, according to the embodiment, it is possible to realize both low on-resistance and high breakdown tolerance that are required, for example, for power control.

Figure 6:
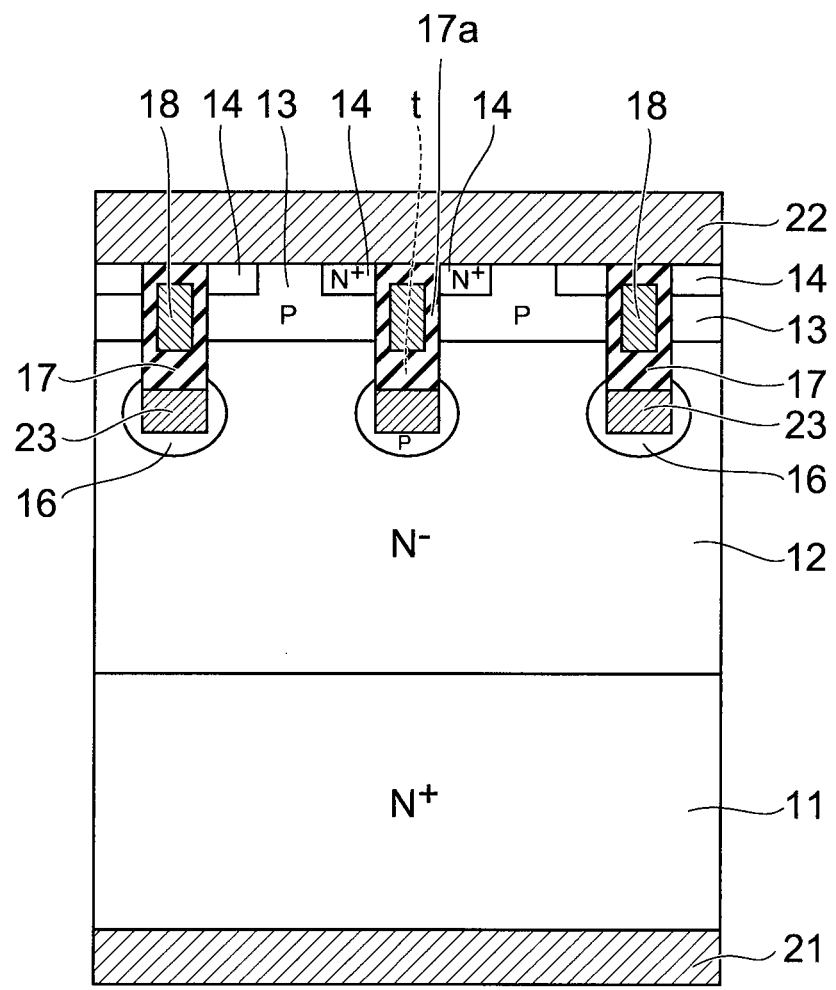
FIG. 6 is a schematic cross-sectional view of another example of the semiconductor device in the first embodiment.

Incidentally, as shown in FIG. 6, it may be arranged such that parts of the P-type base layer 13 are exposed from the N+-type source layer 14 to be in contact with the second major electrode 22 between the adjacent trenches t.

Figure 8:
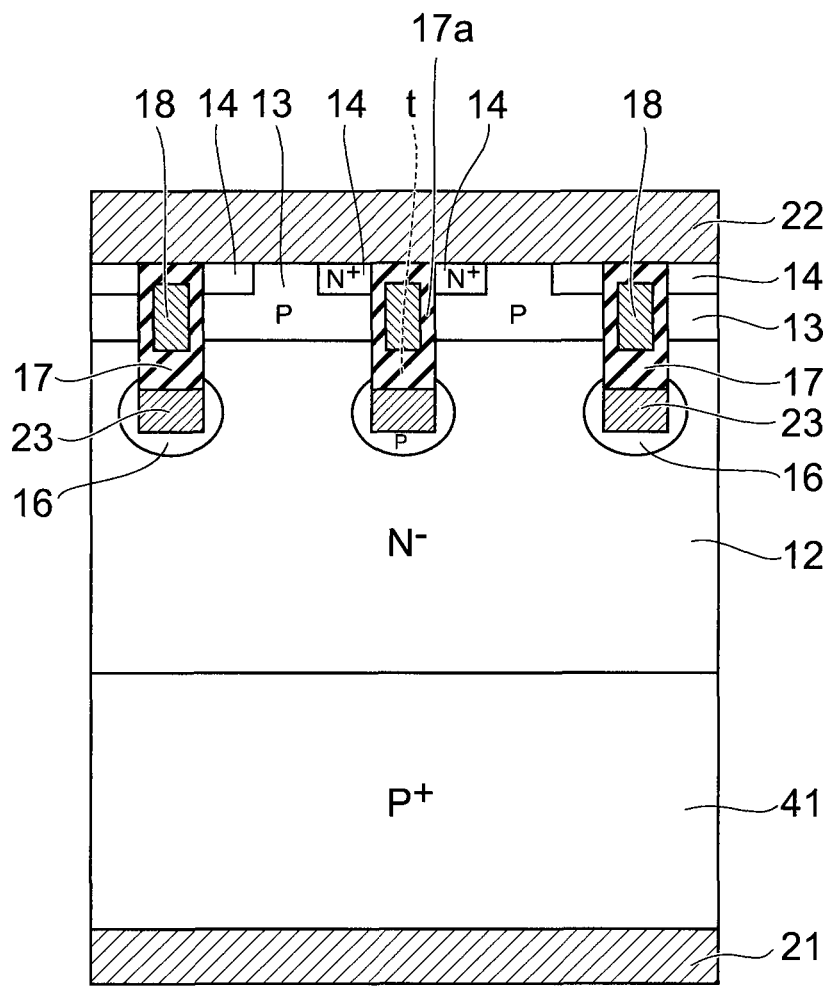
FIG. 8 is a schematic cross-sectional view of a semiconductor device in a first example of the embodiment.

The N+-type drain layer 11 shown in FIG. 6 may be replaced with the P+-type collector layer 41 shown in FIG. 8 as IGBT.

In this case, the avalanche current (hole current) can be caused to flow into the second major electrode 22 via the P-type base layer 13 and the P-type buried layer 16. Therefore, it is possible to further improve the breakdown tolerance.

Moreover, even in the case where a contact area between the P-type base layer 13 and the second major electrode 22 becomes smaller by reducing the trench interval to reduce the on-resistance, since the holes can be discharged through the P-type buried layer 16, the device breakdown does not occur.

The trench structure part according to the embodiment can be formed, for example, in the following manner.

For example, the trench t is formed first, and then a P-type impurity is injected into the bottom portion of the trench t. Thereafter, heat treatment is performed to diffuse the P-type impurity thus injected. As a result, the P-type buried layer 16 is formed. Here, the heat treatment may be performed after forming the buried electrode 23, the insulating film 17 and the gate electrode 18.

After injecting the P-type impurity into the bottom portion of the trench t, the buried electrode 23 is buried in the bottom portion of the trench t. Thereafter, the insulating film 17 is formed on the buried electrode 23 and the side wall of the trench t. Thereafter, the gate electrode 18 is buried inside the insulating film 17.

SECOND EMBODIMENT

Figure 4:
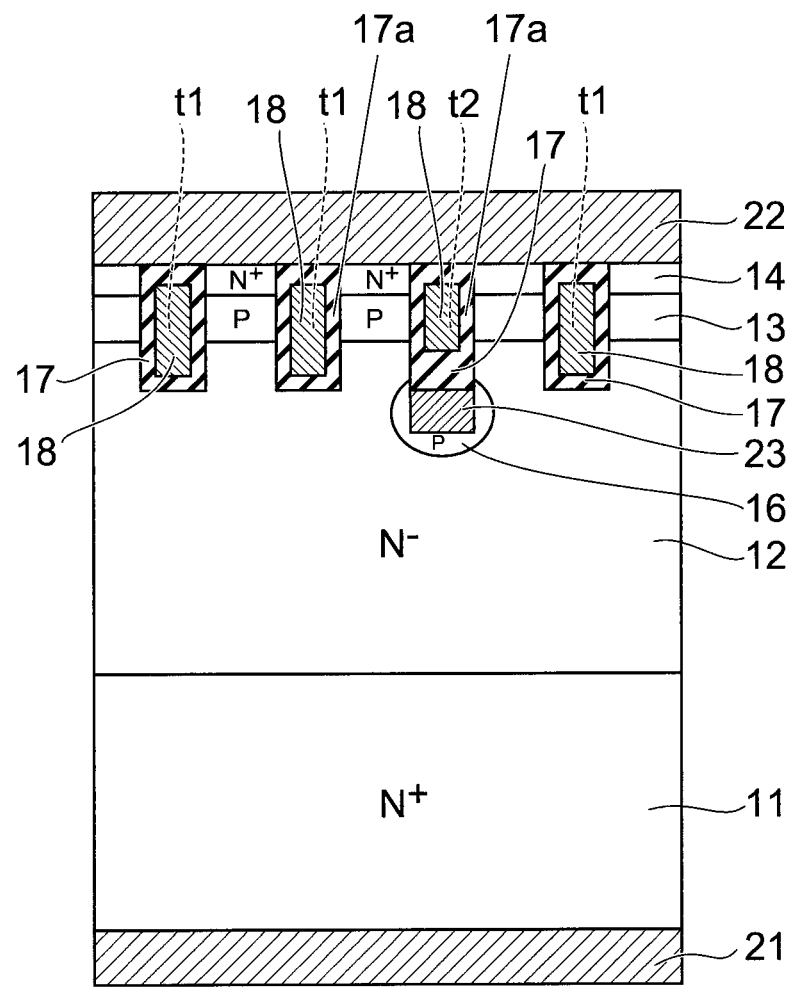
FIG. 4 is a schematic cross-sectional view of a semiconductor device in a second embodiment.

As shown in FIG. 4, the buried electrode 23 needs not be provided in all the trenches. In FIG. 4, a plurality of trenches are illustrated by dividing them into a first trench t1 and a second trench t2.

The first trench t1 extends from the surface of the $N^+$-type source layer 14 and penetrates the P-type base layer 13 to reach the $N^-$-type base layer 12. The insulating film 17 is formed on the bottom face and the side wall of the first trench t. Inside the insulating film 17, the gate electrode 18 is buried. The gate electrode 18 faces the P-type base layer 13 via the gate insulating film 17a formed on the side wall of the first trench t1.

The second trench t2 also extends from the surface of $N^+$-type source layer 14 and penetrates the P-type base layer 13 to reach the $N^-$-type base layer 12. The second trench t2 is deeper than the first trench t1.

In the $N^-$-type base layer 12, the P-type buried layer 16 is selectively provided. The P-type buried layer 16 is not provided around the bottom portion of the first trench t1. The bottom portion of the second trench t2 reaches the P-type buried layer 16. Namely, the P-type buried layer 16 is adjacent to the bottom face and the side wall in the vicinity of the bottom face of the second trench t2.

The first trench t1 separates the stacked structure of the P-type base layer 13 and the $N^+$-type source layer 14 into plural in a lateral direction. The P-type base layer 13 and $N^+$-type source layer 14 are adjacent to the side wall of the first trench t1. Similarly, the second trench t2 separates the stacked structure of the P-type base layer 13 and the $N^+$-type source layer 14 into plural in the lateral direction. The P-type base layer 13 and the $N^+$-type source layer 14 are adjacent to the side wall of the second trench t2.

In the bottom portion of the second trench t2, the buried electrode 23 is provided. The bottom face and the side face of the buried electrode 23 are in ohmic contact with the P-type buried layer 16.

On the buried electrode 23 in the second trench t2, the gate electrode 18 is provided via the insulating film 17. On the side wall of the second trench t2 at a portion above the buried electrode 23, the gate insulating film 17a is formed. The gate electrode 18 in the second trench t2 faces the P-type base layer 13 with the gate insulating film 17a therebetween.

In the embodiment also, a part of the buried electrode 23 is led to the above to be connected to the second major electrode 22 in the same manner as the above described first embodiment. Therefore, the buried layer 16 in ohmic contact with the buried electrode 23 is electrically connected to the second major electrode 22 via the buried electrode 23.

In the embodiment also, in the state where relatively high potential is applied to the first major electrode 21 and relatively low potential is applied to the second major electrode 22, when a desired gate potential is applied to the gate electrode 18 in the first trench t1 and the gate electrode 18 in the second trench t2, an inversion layer (channel) is formed in a vicinity of the interface with the gate insulating film 17a in the P-type base layer 13, to form an on state.

Moreover, avalanche current (hole current) flows into the second major electrode 22 via the P-type buried layer 16 and the buried electrode 23 in ohmic contact with this buried layer 16. As a result, a device breakdown can be suppressed.

By making the second trench t2 deeper than the first trench t1, it is possible to provide the P-type buried layer 16 and the buried electrode 23 at deeper positions than the first trench t1. The P-type buried layer 16 is in contact with the bottom portion of the buried electrode 23 at a deeper position than the first trench t1. Therefore, it is possible to effectively flow the avalanche current (hole current), which is liable to be generated in a vicinity of the bottom portion of the trench, into the second major electrode 22 via the P-type buried layer 16 and the buried electrode 23.

In the configuration wherein the P-type buried layer 16 is provided in both of the adjacent trenches, if an interval between the adjacent P-type buried layers 16 becomes narrower or the adjacent P-type buried layers 16 are adjoined to each other, the flow of electrons in a vertical direction in the on state is disturbed.

In the embodiment, the P-type buried layer 16 and the buried electrode 23 are not provided corresponding to all the trenches but are provided only in the bottom portions of the selected specific trenches (second trench t2). Therefore, it is possible to design such that the P-type buried layer 16 is formed not in both of the adjacent trenches. As a result, it is possible to reduce the trench interval without disturbing the flow of electrons in the vertical direction.

By reducing the trench interval, it is possible to increase the channel density and reduce the on-resistance. In the embodiment, it is also possible to realize both low on-resistance and high breakdown tolerance.

Therefore, in the case where the P-type buried layer 16 and the buried electrode 23 are selectively provided, it is desirable that they be provided not in both of the adjacent trenches.

THIRD EMBODIMENT

Figure 5:
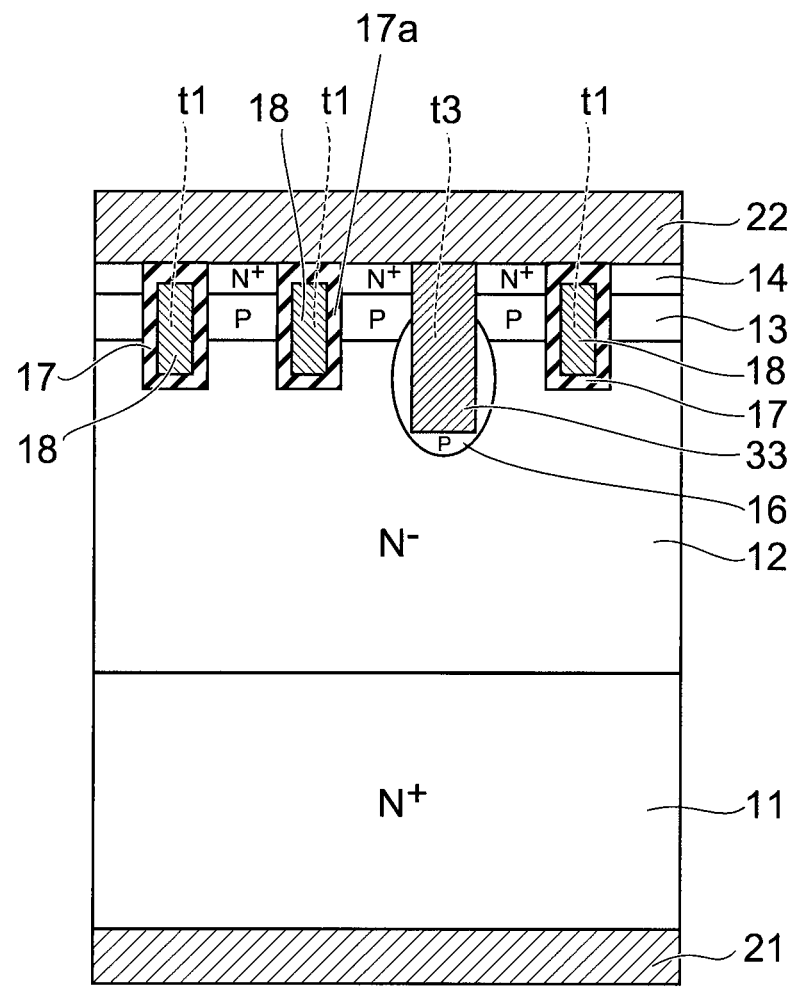
FIG. 5 is a schematic cross-sectional view of a semiconductor device in a third embodiment.

FIG. 5 is a schematic cross-sectional view of a semiconductor device of a third embodiment.

In the embodiment also, the P-type buried layer 16 and a buried electrode 33 are not provided in all the trenches. In FIG. 5, the plurality of trenches are illustrated by dividing them into the first trench t1 and the second trench t3.

The first trench t1 extends from the surface of the $N^+$-type source layer 14 and penetrates the P-type base layer 13 to reach the $N^-$-type base layer 12. The insulating film 17 is formed on the bottom face and the side wall of the first trench t. Inside the insulating film 17, the gate electrode 18 is buried. The gate electrode 18 faces the P-type base layer 13 via the gate insulating film 17a formed on the side wall of the first trench t1.

The second trench t3 also extends from the surface of $N^+$-type source layer 14 and penetrates the P-type base layer 13 to reach the $N^-$-type base layer 12. In the case where the second trench t3 is deeper than the first trench t1, the holes at avalanche breakdown can be effectively discharged into the second major electrode 22. However, in the case where the second trench t3 is not deeper than the first trench t1, some holes at avalanche breakdown can be discharged into the second major electrode 22.

In the N⁻-type base layer 12, the P-type buried layer 16 is selectively provided. The P-type buried layer 16 is not provided around the bottom portion of the first trench t1. The bottom portion of the second trench t3 reaches the P-type buried layer 16. The P-type buried layer 16 is adjacent to the bottom face of the second trench t3. Further, the P-type buried layer 16 is adjacent to the side wall of the second trench t3 at a portion below the P-type base layer 13. The second trench t3 divides the stacked structure of the P-type base layer 13 and the N⁺-type source layer 14 into plural in a lateral direction.

Inside the second trench t3, the buried electrode 33 is provided. The buried electrode 33 is filled in the second trench t3 from the bottom portion to the opening. The bottom face and the side face of the buried electrode 33 are in ohmic contact with the P-type buried layer 16. The buried electrode 33 is made of a semiconductor material (for example polycrystalline silicon) to which an impurity is added and which has conductivity, or a metallic material.

The second major electrode 22 is provided also on the second trench t3 so as to be in contact with the upper end of the buried electrode 33 buried in the second trench t3. The P-type buried layer 16 in ohmic contact with the buried electrode 33 is electrically connected to the second major electrode 22 via the buried electrode 33.

The gate electrode 18 is not provided in the second trench t3. The respective side faces of the N⁺-type source layer 14 and the P-type base layer 13 which are adjacent to the second trench t3 are in contact with the side face of the buried electrode 33.

In the embodiment also, in the state where relatively high potential is applied to the first major electrode 21 and relatively low potential is applied to the second major electrode 22, when a desired gate potential is applied to the gate electrode 18 in the first trench t1, an inversion layer (channel) is formed in a vicinity of the interface with the gate insulating film 17a in the P-type base layer 13 adjacent to the first trench t1, to form an on state.

Moreover, avalanche current (hole current) flows into the second major electrode 22 via the P-type buried layer 16 and the buried electrode 33 in ohmic contact with this buried layer 16. As a result, a device breakdown can be suppressed. Further, since the side face of the P-type base layer 13 is in contact with the buried electrode 33, avalanche current (hole current) flows into the second major electrode 22 via the P-type base layer 13 and the buried electrode 33. As a result, a still higher breakdown tolerance can be obtained.

In the embodiment also, the P-type buried layer 16 and the buried electrode 33 are not provided corresponding to all the trenches but are provided only in the selected specific trenches (second trench t3). Therefore, it is possible to design such that the P-type buried layer 16 is provided not in both of the adjacent trenches. As a result, it is possible to reduce the trench interval without disturbing the flow of electrons in the vertical direction.

By reducing the trench interval, it is possible to increase the channel density and reduce the on-resistance (on-voltage). In the embodiment also, it is possible to realize both low on-resistance (low on-voltage) and high breakdown tolerance. Therefore, it is desirable that the P-type buried layer 16 and the buried electrode 33 be provided not in both of the adjacent trenches.

FOURTH EMBODIMENT

Figure 7:
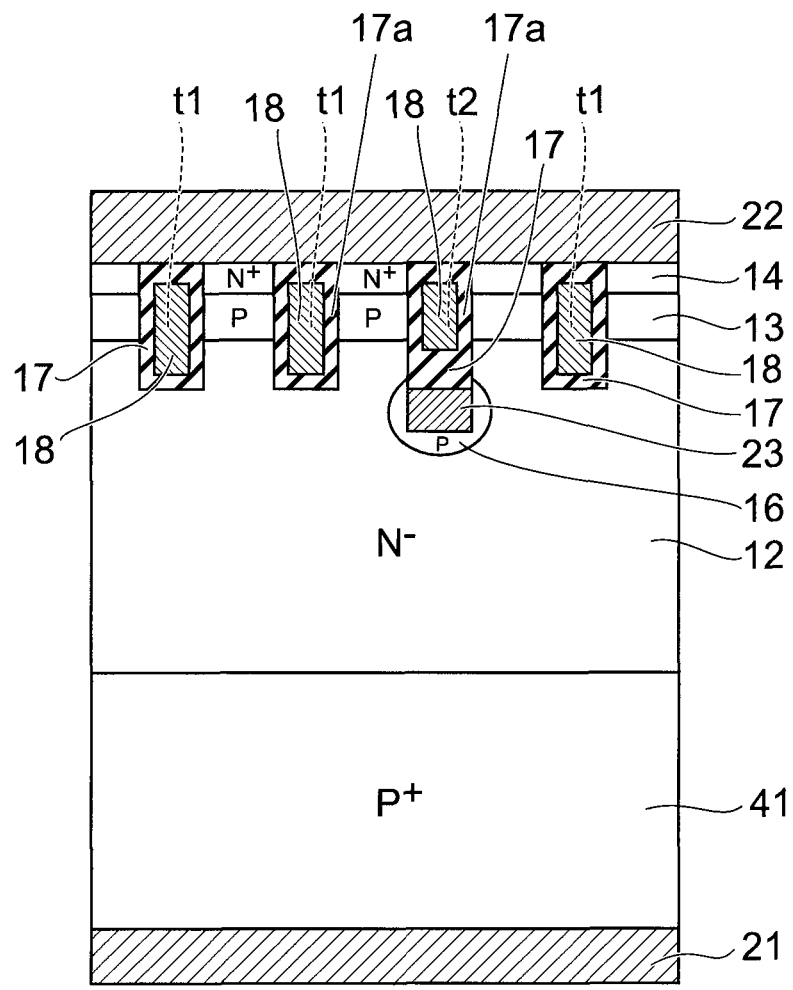
FIG. 7 is a schematic cross-sectional view of a semiconductor device in a fourth embodiment.

FIG. 7 is a schematic cross-sectional view illustrating an Insulated Gate Bipolar Transistor (IGBT) as a semiconductor device of a fourth embodiment.

This IGBT, for example, has a configuration wherein the N⁺-type drain layer 11 is replaced with a P⁺-type collector layer 41 in the semiconductor device of the second embodiment shown in FIG. 4.

In the embodiment also, in the state where relatively high potential is applied to the first major electrode 21 and relatively low potential is applied to the second major electrode 22, when a desired gate potential is applied to the gate electrode 18 in the first trench t1 and the gate electrode 18 in the second trench t2, an inversion layer (channel) is formed in a vicinity of the interface with the gate insulating film 17a in the P-type base layer 13.

As a result, electrons are injected from the N⁺-type source layer 14 into the N⁻-type base layer 12 via the channel, to form an on-state. Here, holes are further injected from the P⁺-type collector layer 41 into the N⁻-type base layer 12. The electrons injected into the N⁻-type base layer 12 flow into the first major electrode 21 through the P⁺-type collector layer 41. The holes injected into the N⁻-type base layer 12 flow into the second major electrode 22 via the P-type buried layer 16 and the buried electrode 23. In the IGBT, in the on state, holes are injected from the P⁺-type collector layer 41 into the N⁻-type base layer 12, which in turn causes conductivity modulation, and thereby the resistance of the N⁻-type base layer 12 is reduced.

Avalanche current (hole current) flows into the second major electrode 22 via the P-type buried layer 16 and the buried electrode 23 in ohmic contact with the buried layer 16. As a result, a device breakdown can be suppressed.

Moreover, according to the embodiment, the P-type base layer 13 and the second major electrode 22 are not in contact with each other between the adjacent trenches including the region where the channel is formed. Therefore, in the on-state, holes are stored in the portion on the side of the P-type base layer 13 of the N⁻-type base layer 12. The holes as stored expedite the injection of the electrodes into the n⁻-type base layer 12. As a result, the on-voltage can be reduced.

According to the embodiment, it is also possible to realize both low on-resistance (low on-voltage) and high breakdown tolerance.

Figure 9:
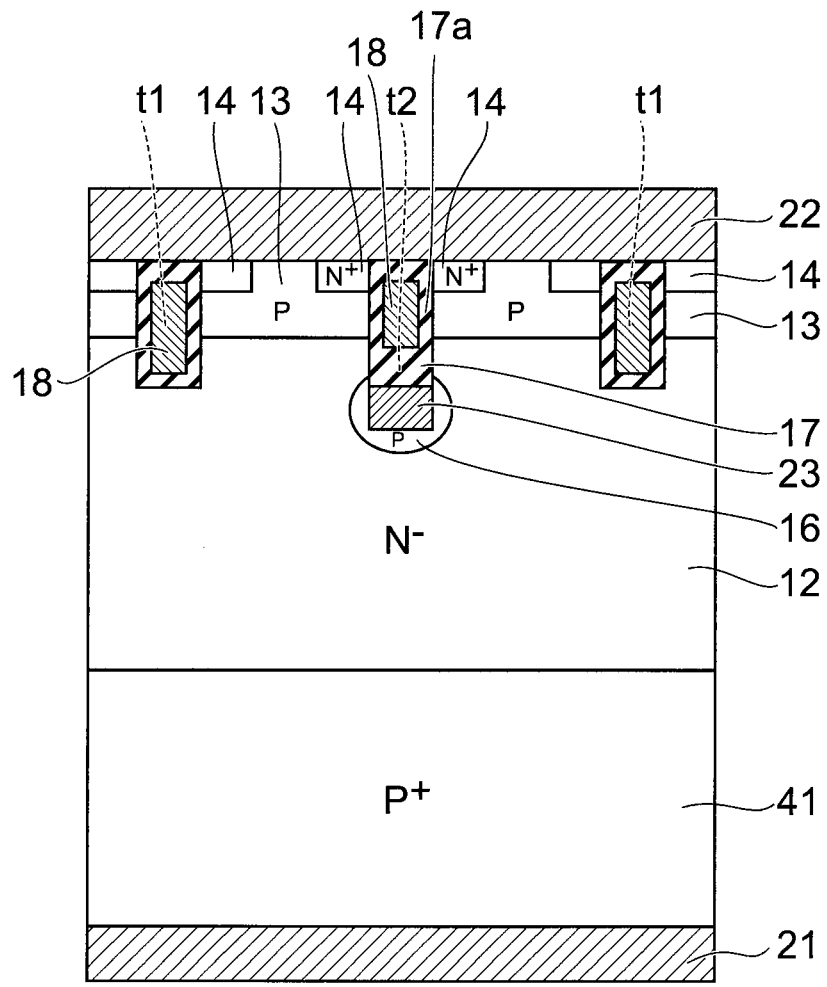
FIG. 9 is a schematic cross-sectional view of a semiconductor device in a second example of the embodiment.

According to the embodiment, as shown in FIG. 9, it may be arranged such that parts of the P-type base layer 13 are exposed from the N⁺-type source layer 14 to be in contact with the second major electrode 22 between the adjacent trenches.

Figure 10:
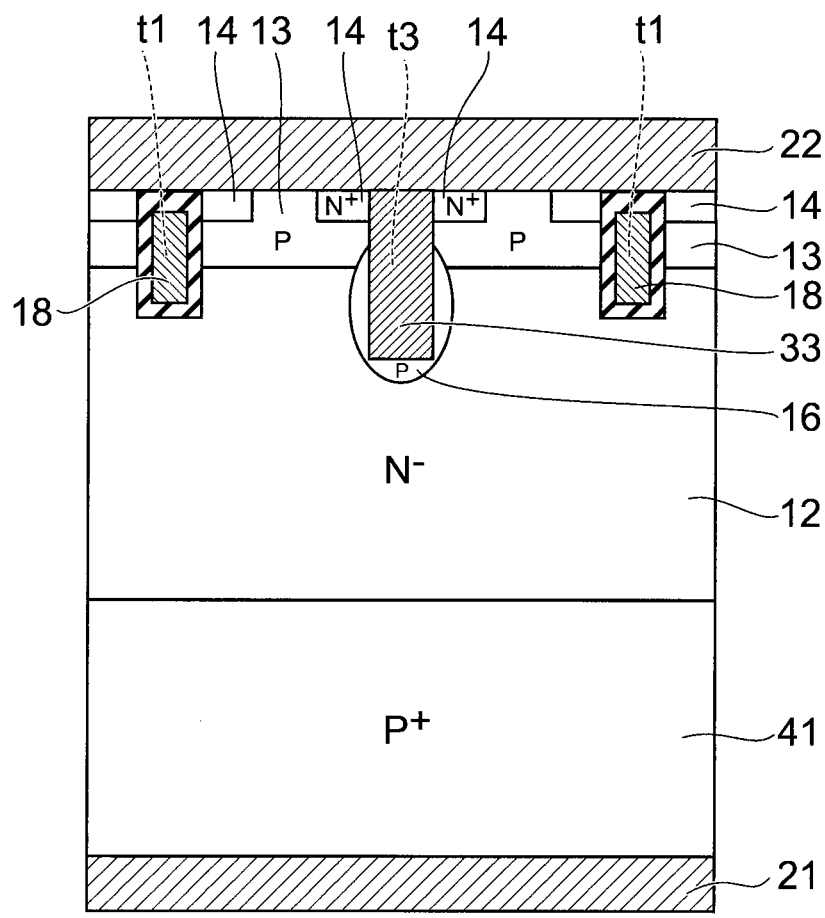
FIG. 10 is a schematic cross-sectional view of a semiconductor device in a third example of the embodiment.

The trench structure including the trench t2, the buried electrode 23 and the p-type buried layer 16 in FIG. 9 may be replaced with the trench structure including the trench t3, the buried electrode 33 and the p-type buried layer 16 of the third embodiment in FIG. 5, as shown in FIG. 10.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a first conductivity-type base layer provided on the first electrode;

a second conductivity-type base layer provided on the first conductivity-type base layer;

a semiconductor layer of the first conductivity type provided on the second conductivity-type base layer;

a gate electrode extending through the semiconductor layer and the second conductivity-type base layer and terminating inwardly of the first conductivity-type base layer, and separated from the first conductivity-type base layer, the second conductivity-type base layer and the semiconductor layer by a gate insulating film, the gate electrode including a plurality of gate electrode portions;

a layer of the second conductivity type selectively provided in the first conductivity-type base layer;

a second electrode extending through the semiconductor layer and the second conductivity-type base layer and terminating inwardly of the layer, the second electrode being in contact with the layer, the second electrode including a first electrode portion and a second electrode portion provided adjacent to the first electrode portion, the plurality of gate electrode portions provided between the first electrode portion and second electrode portion; and a third electrode provided on the semiconductor layer and being electrically connected to the semiconductor layer and the second electrode.

2. The device according to claim 1, wherein the plurality of gate electrode portions includes:

a first gate electrode portion provided between the first electrode portion and the second electrode portion; and a second gate electrode portion provided adjacent to the first gate electrode portion, the first electrode portion provided between the first gate electrode portion and second gate electrode portion.

3. The device according to claim 1, further comprising a second gate electrode provided on the second electrode via an insulating film, and electrically connected to the gate electrode.

4. The device according to claim 1, wherein the third electrode is provided also on the second electrode so as to be in contact with an upper end of the second electrode.

5. The device according to claim 4, wherein the second conductivity-type base layer is in contact with a side face of the second electrode.

6. The device according to claim 1, wherein the layer is in contact with a bottom portion of the second electrode at a deeper position than the gate electrode.

7. The device according to claim 1, wherein the layer is in contact with a bottom face and a side face of the second electrode.

8. The device according to claim 1, wherein the second electrode is a semiconductor containing an impurity and having conductivity.

9. The device according to claim 1, wherein the semiconductor layer is provided in a striped planar pattern overlapped on the second conductivity-type base layer with a same width as the second conductivity-type base layer.

10. A semiconductor device, comprising:

a first electrode;

a first conductivity-type base layer provided on the first electrode;

a second conductivity-type base layer provided on the first conductivity-type base layer;

a semiconductor layer of the first conductivity type provided on the second conductivity-type base layer;

a gate electrode extending through the semiconductor layer and the second conductivity-type base layer and terminating inwardly of the first conductivity-type base layer, and separated from the first conductivity-type base layer, the second conductivity-type base layer and the semiconductor layer by a gate insulating film, the gate electrode including a first gate electrode portion, a second gate electrode portion, and a third gate electrode portion provided between the first gate electrode portion and second gate electrode portion, the third gate electrode portion provided adjacent to the second gate electrode portion;

a layer of the second conductivity type selectively provided in the first conductivity-type base layer;

a second electrode extending through the semiconductor layer and the second conductivity-type base layer and terminating inwardly of the layer, the second electrode being in contact with the layer, the second electrode provided between the first gate electrode portion and the third gate electrode portion, the second electrode provided adjacent to the first gate electrode portion and the third gate electrode portion; and a third electrode provided on the semiconductor layer and being electrically connected to the semiconductor layer and the second electrode.

* * * * *